United States Patent
Schwarz et al.

(10) Patent No.: US 6,211,656 B1
(45) Date of Patent: Apr. 3, 2001

(54) METHOD AND DEVICE FOR DETERMINING THE CHARGING CURRENT OF AN ACCUMULATOR

(75) Inventors: Thomas Schwarz, Rhede; Wolfgang Menz, Hamminkeln, both of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/508,707
(22) PCT Filed: Jul. 27, 1998
(86) PCT No.: PCT/DE98/02123
§ 371 Date: Mar. 14, 2000
§ 102(e) Date: Mar. 14, 2000
(87) PCT Pub. No.: WO99/14567
PCT Pub. Date: Mar. 25, 1999

(30) Foreign Application Priority Data

Sep. 15, 1997 (DE) .............................................. 197 40 559

(51) Int. Cl.$^7$ .......................... H01M 10/44; H01M 10/46
(52) U.S. Cl. .............................................. 320/150; 320/153
(58) Field of Search .................................... 320/124, 125, 320/127, 132, 134, 136, 144, 150, 152, 153, 160, 162, 164

(56) References Cited

U.S. PATENT DOCUMENTS

| | | | |
|---|---|---|---|
| 5,013,993 | * | 5/1991 | Bhagwat et al. . |
| 5,136,231 | * | 8/1992 | Faulk . |
| 5,459,671 | | 10/1995 | Duley . |
| 5,642,027 | * | 6/1997 | Windes et al. . |

FOREIGN PATENT DOCUMENTS

| | | |
|---|---|---|
| 196 34 267 A1 | 2/1998 | (DE) . |
| 0 526 874 A2 | 2/1993 | (EP) . |

OTHER PUBLICATIONS

Patent Abstracts of Japan, vol. 10, No. 282, Sep. 25, 1986, & JP 61 102529 A, May 21, 1986.

"Lead–Acid Battery Charger has Thermal Control", Linear Technology, Coliseum Business Centre, Electronics World & Wireless World, Mar. 1994, p. 237.

* cited by examiner

*Primary Examiner*—Edward H. Tso
(74) *Attorney, Agent, or Firm*—Schiff Hardin & Waite

(57) ABSTRACT

A method and a circuit arrangement for determining the charging current and the temperature of an accumulator, wherein a part of the charging current is amplified via a transistor that is in thermal contact with the accumulator. An output voltage of the transistor amplifier circuit is measured once at a known temperature for determining a reference value. The output voltage is measured at the temperature to be identified with the charging current switched off and the output voltage is measured at the same temperature with the charging current switched on. The temperature and the charging current are then determined from the reference value, from the voltage with the charging current turned off and from the voltage with the charging current turned on.

10 Claims, 1 Drawing Sheet

METHOD AND DEVICE FOR DETERMINING THE CHARGING CURRENT OF AN ACCUMULATOR

BACKGROUND OF THE INVENTION

The invention is directed to a method for determining the charging current and the temperature of an accumulator or secondary battery.

The invention is also directed to a circuit arrangement for determining the charging current and the temperature of an accumulator or secondary battery given the assistance of a calculating and control unit.

Particularly in mobile radio telephone devices, for example cordless telephones, GSM cell phones, etc., both the charging current flowing into the accumulator as well as the temperature of the accumulator may be measured for monitoring the charge of the installed accumulator and, monitored with the assistance of a calculating and control unit, (e.g. a micro-processor with present in the mobile radio telephone device.

It is known to employ a voltage divider with a NTC resistor for temperature measurement, the NTC resistor being in thermal contact with the accumulator. The temperature-dependent change of the value of resistance of the NTC resistor yields a voltage change at the voltage divider that represents a criterion for the temperature change of the NTC resistor and, thus, of the accumulator. The characteristic of a NTC resistor is non-linear and, for exact temperature measurements, either a narrowly toleranced NTC resistor must be employed or the circuit must be balanced at a specific temperature. The output voltage of the voltage divider is usually converted into a digital value with the assistance of an A/D converter, this digital value being further-processed in the calculating and control unit and also being capable of being utilized for the control and regulation of the charging event, such as for controlling a charging current switch, for example.

The measurement of the charging current usually ensues with the assistance of a precision resistor; i.e., of a shunt traversed by the charging current, wherein the voltage drop across the precision resistor is amplified in a separate amplifier circuit and is then input to an A/D converter whose digital output value is available to the calculating and control unit.

The above-described way of determining charging current and accumulated temperature is comparatively complicated, particularly when greater precision of the measurements is desired.

A feature of the present invention is to create a method and an arrangement for determining charging current and temperature of an accumulator that enable exact measurements with feasible outlay. In particular, a feature of the invention is to make both required values available with the assistance of a single circuit arrangement.

These features are achieved with a method of the previously des wherein a part of the charging current is inventively amplified via a transistor that is in thermal contact with the accumulator. An output voltage of the transistor amplifier circuit is measured once at a known temperature for determining a reference value. The output voltage is then measured at the temperature to be determined with the charging current turned off and is measured at the same temperature with the charging current turned on. The temperature and the charging current are then computationally determined from the reference value, the voltage with the charging current turned off and the voltage with the charging current turned on.

The invention utilizes the temperature-dependency of the base-emitter voltage of a transistor that works in an amplifier circuit for the charging current, so that both the temperature as well as the charging current can be determined by corresponding interpretation of a single output voltage with the charging current turned on and off. Since a microprocessor, as well as a controlled charging current switch, are usually already available in the standard applications, the required outlay for component parts is minimal.

A very simple determination of the charging current derives when the charging current I is determined according to the equation $I=(U_{A,I}-U_{A,o})/V_I$, where $V_I$ denotes the gain $\Delta U_A/\Delta I$ for current changes.

On the other hand, the temperature can be easily determined when the temperature T is computationally determined according to the equation $T=T_o+(U_{A,o}-U_{Ref})/V_T$, whereby $V_T$ denotes the gain $\Delta U_A/\Delta T$ of the transistor circuit for temperature changes.

A silicon transistor is advantageously employed in the invention, since the temperature-dependency of the base-emitter voltage of a Si transistor is especially suited for the purpose of the subject.

The features of the invention are also achieved with a circuit arrangement of the previously discussed species wherein a transistor operated in an amplifier circuit is brought into thermal contact with the accumulator. Charging current is supplied to the accumulator via a controlled charging current switch. A part of the charging current is supplied to the input of the amplifier circuit, and an output voltage of the amplifier circuit is supplied to a calculating and control unit via which the switch is also controlled. The calculating and control unit is configured for calculating the temperature at the charging current from a reference value of the output voltage determined, given an opened charging current switch a known temperature, the value of the output voltage determined at the temperature to be identified and with an opened charging current switch, and the value of the output voltage determined at the temperature to be determined and given the charging current switched on.

The advantages of such a circuit arrangement lie in the high precision of the identified values of temperature and charging current of an accumulator that can be achieved given little outlay. The circuit was mainly developed for use in mobile radio telephone devices, (e.g.,) cordless telephones that are charged at a base station or in a charging shell. However, it is fundamentally suited for other types of accumulator-operated electronic devices such as radios, television sets, lap tops, etc.

For a simple determination of the charging current, it is preferable to configure the calculating and control unit to determine the charging current I according to the equation $I=(U_{A,I}-U_{A,o})/V_I$, where $V_I$ denotes the gain $\Delta U_A/\Delta T$ of the transistor circuit for current changes.

The temperature can be determined with little outlay when the calculating and control unit is configured for determining the temperature T according to the equation $T=T_o+(U_{A,o}, U_{A,Ref})/V_T$, where $V_T$ denotes the gain $\Delta U_A/\Delta T$ of the transistor circuit for temperature changes.

The acquisition of the charging current takes on an especially simple form when a precision resistor lies in the charging current branch and the voltage drop-off at this resistor is supplied to the amplifier circuit. The voltage drop-off can thereby be expediently supplied to the base of the transistor via a base resistor.

Additional advantages and novel features of the invention will be set forth, in part, in the description that following and, in part, will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWING

The invention together with further advantages thereof is explained in greater detail below with reference to the drawing, which shows a simplified block circuit diagram of a charging circuit with further details regarding the amplifier circuit.

DETAILED DESCRIPTION OF THE PREFERRED EMBODIMENTS

Figure 1:
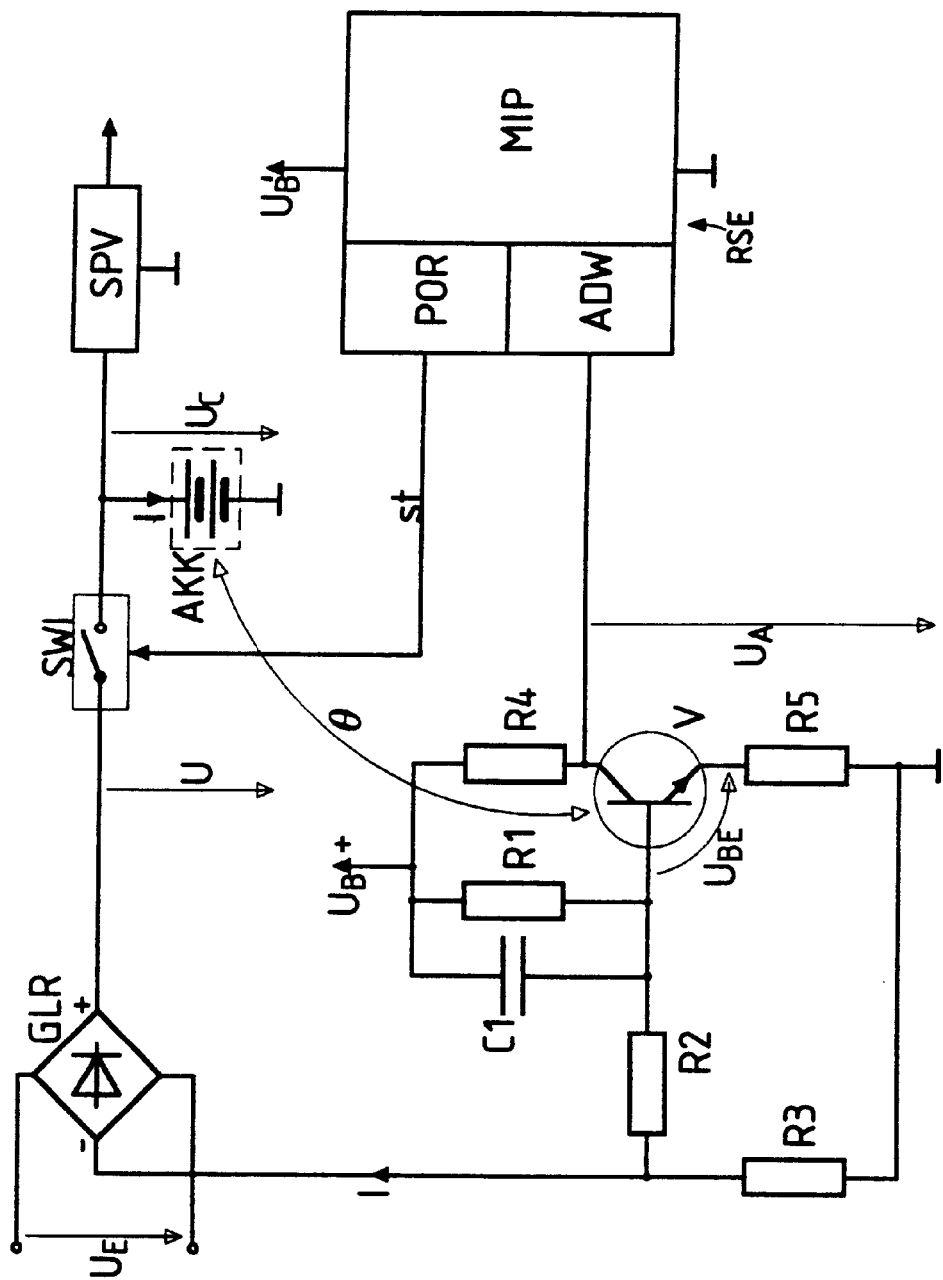

As can be derived from the single FIGURE of the drawing, a DC voltage U is supplied to an accumulator AKK via a controlled switch SWI a current I flows from the positive pole of the DC voltage U via the accumulator AKK, via ground and a precision resistor R3 to the negative pole of the DC voltage U. This voltage U can, for example, be obtained from an input voltage $U_E$, generally an alternating voltage, via a rectifier GLR. The accumulator voltage $U_c$ is available to the user (not shown here), often upon interposition of a voltage supply unit SPV that, for example, contains a regulated DC voltage/DC voltage converter.

A voltage drop proportional to the current I occurs across the precision resistor R3 this being supplied to an amplifier circuit having a transistor V, such as an NPN silicon transistor here. The transistor V has its collector at a supply voltage $U_B$ via a collector resistor R4. The circuit also shows an emitter resistor R5 and a base resistor R2. A resistor R1 that lies between the positive supply voltage $U_B$ and the base of the transistor and that is bridged by a filter capacitor C1 also serves for setting the operating point.

The output voltage $U_A$ of the amplifier circuit is supplied to an analog/digital converter ADW of a calculating and control unit RSE that also contains a microprocessor MIP and an output port POR from which a control line ST leads to the controlled switch SWI. The calculating and control unit RSE is operated at a voltage $U_B'$ that can be identical to the voltage $U_B$, and such a unit, for example, is already contained in a mobile part of a mobile radio telephone or cordless telephone system.

The circuit and the method of the invention, particularly the determination of the temperature T and the charging current I of the accumulator AKK are set forth in greater detail below, to which end it should be pointed out first that transistor V and accumulator AKK are in close thermal contact, represented by an arrow θ.

The voltage at the precision resistor R3 is the determining factor for the size of the charging current I; the base-emitter voltage $U_{BE}$ of. The transistor V is the determining factor for the temperature. This voltage is temperature-dependent, where, for silicon, $\Delta U_{BE}/\Delta T = S(T) = -1.85$ mV/k.

First, with the charging current turned off and with a known temperature $T_o$, a one-time reference measurement ensues, and the output voltage is then respectively identified with charging current and without charging current.

The gain $V_I$ of the circuit for the charging current shown by way of example derives as follows:

$$V_I = \frac{\Delta U_A}{\Delta I}$$

$$\Delta U_{R3} = -R_3 \cdot \Delta I$$

$$\Delta U_B = \Delta U_{R3} \cdot \frac{R_1}{R_1 + R_2} = -\Delta I \frac{R_1 \cdot R_3}{R_1 + R_2}$$

$$\Delta U_A = -\Delta U_B \cdot \frac{R_4}{R_5} = \Delta I \frac{R_1 \cdot R_3 \cdot R_4}{(R_1 + R_2) \cdot R_5}$$

$$V_I = \frac{\Delta U_A}{\Delta I} = \frac{R_1 \cdot R_3 \cdot R_5}{(R_1 + R_2) \cdot R_5}$$

The gain $V_T$ for the temperature derives as follows:

$$V_T = \frac{\Delta U_A}{\Delta T}$$

$$\Delta U_A = \Delta U_{BE} \cdot \frac{R_4}{R_5}$$

$$V_T = \frac{\Delta U_A}{\Delta T} = \frac{\Delta U_{BE}}{\Delta T} \cdot \frac{R_4}{R_5} = S(T) \cdot \frac{R_4}{R_5}$$

The reference value $U_{ARef}$ is identified given $T=T_o$ and $I=0$, for example during manufacture of the corresponding device, and is stored in the calculating and control unit.

For determining the respective values of T and I, the value $U_{A,o}$ given $I=0$ and the value $U_{A,I}$ given I are determined, both at the temperature T.

Charging current and temperature can then be calculated as follows:

$$I = \frac{U_{A'I} - U_{A'O}}{V_I}$$

$$T = T_O + \frac{U_{A,O} - U_{A,ref}}{V_T}$$

These measurements and calculations can be unproblematically implemented at any arbitrary point in time with the assistance of the amplifier circuit or, the microprocessor MIP, and the required regulation and control measures, for example the switching of the charging current switch SWI, are implemented on the basis of the identified values of I and T.

The obvious advantages of the invention are comprised in that only an A/D converter is additionally required. Only seven components (i.e., a transistor, five resistors and a capacitor, are required for the amplifier circuit; a balancing of the circuit is not required, and only a one-time reference measurement.

It is self-evident to a person skilled in the art that the amplifier circuit can also be modified, wherein essence is that the output voltage is dependent both on the charging current as well as on the base-emitter voltage of the transistor.

While this invention has been described in connection with what is presently considered the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A method for determining a charging current and a temperature to be identified of an accumulator, comprising the steps of:

placing a transistor in thermal contact with the accumulator;

amplifying at least a portion of the charging current via a transistor amplifier circuit that includes the transistor that is in thermal contact with the accumulator;

measuring an output voltage of the transistor amplifier circuit at a known temperature to determine a reference voltage value;

turning off the charging current and measuring the output voltage at the temperature to be identified to determine a first voltage value;

turning on the charging current and measuring the output voltage at the same temperature to be identified to determined a second voltage value; and determining the temperature to be determined and the charging current computationally from the reference value, the first voltage value with the charging current turned off and the second voltage value with the charging current turned on.

2. The method according to claim 1, wherein the charging current is computationally determined according to the equation $I=(U_{A,I}-U_{A,O})/V_I$, where $V_I$ denotes a gain $\Delta U_A/\Delta I$ of the transistor amplifier circuit for current changes, $U_{A,I}$ denotes the second voltage value and $U_{A,O}$ denotes the first voltage value.

3. The method according to claim 1, wherein the temperature to be identified is computationally determined according to the equation $T=T_o+(U_{A,o}-U_{A,Ref})/V_T$, where $V_T$ denotes a gain $\Delta U_A/\Delta T$ of the transistor circuit for temperature changes, $T_o$ denotes the known temperature, $U_{A,o}$ denotes the first voltage value and $U_{A,Ref}$ denotes the reference voltage value.

4. The method according to claim 1, wherein the transistor is a silicon transistor.

5. A circuit arrangement for determining a charging current and a temperature to be determined of an accumulator comprising:

an accumulator;

a power supply;

a calculating and control unit;

a controlled charging current switch disposed between the power supply and the accumulator, the switch configured to supply the charging current to the accumulator and controlled by the calculating and control unit;

an amplifier circuit having an input, an output and at least a transistor that is in thermal contact with the accumulator; and a connection between the output of the amplifier circuit and the calculating and control unit configured to supply an output voltage of the amplifier circuit to the calculating and control unit;

wherein at least a portion of the charging current is supplied to the input of the amplifier circuit via a charging current branch; and wherein the calculating and control unit is configured to calculate the temperature to be identified and the charging current based on:

(1) a reference value of the output voltage determined when the calculating and control unit opens the charging current switch and the accumulator is at a known temperature;

(2) a first voltage value of the output voltage determined at the temperature to be identified and with the charging current switch opened; and (3) a second voltage value determined at the temperature to be identified and with the charging current turned via closing of the charging current switch by the calculating and control unit.

6. The circuit arrangement according to claim 5, wherein the calculating and control unit is configured for determining the charging current according to the equation $I=(U_{A,I}-U_{A,O})/V_I$, where $V_I$ denotes a gain $\Delta U_A/\Delta I$ of the transistor amplifier circuit for current changes, $U_{A,I}$ denotes the second voltage value and $U_{A,O}$ denotes the first voltage value.

7. The circuit arrangement according to claim 5, wherein the calculating and control unit is configured for determining the temperature to be identified according to the equation $T=T_o+(U_{A,O}-U_{A,Ref})/V_T$, where $V_T$ denotes a gain $\Delta U_A/\Delta T$ of the transistor circuit for temperature changes, $T_o$ denotes the known temperature $U_{A,O}$ denotes the first voltage value and $U_{A,Ref}$ denotes the reference voltage value.

8. The circuit arrangement according to claim 5 further comprising:

a precision resistor is disposed in series within the charging current branch, and a voltage drop across this resistor is supplied to the amplifier circuit.

9. The circuit arrangement according to claim 8, wherein the voltage drop is supplied to a base of the transistor via a base resistor.

10. The circuit arrangement according to claim 5, wherein the transistor is a silicon transistor.

* * * * *